United States Patent [19]

Qureshi

[11] Patent Number: 5,574,731

[45] Date of Patent: Nov. 12, 1996

[54] SET/RESET SCAN FLIP-FLOPS

[75] Inventor: Fazal U. R. Qureshi, Cupertino, Calif.

[73] Assignee: National Semiconductor Corporation, Santa Clara, Calif.

[21] Appl. No.: 429,944

[22] Filed: Apr. 27, 1995

Related U.S. Application Data

[63] Continuation-in-part of Ser. No. 392,086, Feb. 22, 1995.

[51] Int. Cl.$^6$ .................................................. G01R 31/28
[52] U.S. Cl. ............................................................. 371/22.3
[58] Field of Search ..................... 326/16, 22; 327/142, 327/198, 200; 371/407, 22.3

[56] References Cited

U.S. PATENT DOCUMENTS

| | | | |
|---|---|---|---|
| 4,961,013 | 10/1990 | Obermeyer, Jr. et al. | 327/153 |
| 5,185,537 | 2/1993 | Creedon et al. | 327/34 |
| 5,285,153 | 2/1994 | Ahanin et al. | 324/73.1 |
| 5,406,216 | 4/1995 | Millman et al. | 327/202 |

OTHER PUBLICATIONS

IEEE, IEEE Standard Tap & Boundary–Scan Architecture, pp. 6-4.

Primary Examiner—Robert W. Beausoliel, Jr.
Assistant Examiner—Phillip F. Vales
Attorney, Agent, or Firm—Limbach & Limbach LLP

[57] ABSTRACT

A set/reset scan flip-flop circuit normally inhibits set/reset operations in the scan mode, but allows a set/reset occurring in the last scan cycle to pass through. The circuit includes a multiplexer that receives a data signal and a scan signal. The scan signal is selected as the multiplexer output when Test Enable, which serves as the multiplexer select signal, is active. The Test Enable signal and the set/reset signal are provided as inputs to an OR gate such that, if Test Enable is active high, then the OR gate output is also high. The OR gate output is connected to the set/reset pin of a flip-flop. The multiplexer output drives the data input of the flip-flop. Therefore, assuming that the set/reset signal is active low, when in the scan mode, i.e., Test Enable is active high, the OR gate blocks the set/reset signal from the flip-flop. However, if set/rest goes active low in the last scan cycle, then the low-going Test Enable allows the set/rest to pass through. The circuit covers both synchronous and asynchronous operation. In an alternative embodiment, the clock signal that drives the above-described circuit is also provided to the OR gate to block spurious signals at the beginning of a load cycle, thereby increasing glitch immunity.

8 Claims, 5 Drawing Sheets

SET/RESET SCAN FLIP-FLOPS

RELATED APPLICATIONS

The present application is a Continuation-in-Part of application Ser. No. 08/392,086, filed Feb. 22, 1995, by Fazal Ur Rehmen Qureshi.

BACKGROUND OF THE INVENTION

1. Field of the Invention

The present invention relates to the testing of complex integrated circuits and, in particular, to a set/reset scan flip-flop circuit that normally inhibits active set/reset during scan shift, but allows a set/reset occurring in the last shift cycle to pass through. The circuit may be used in both synchronous and asynchronous scan chain operation. A clock controlled embodiment of the invention also inhibits spurious signals occurring at the beginning of a parallel load cycle.

2. Discussion of the Related Art

FIGS. 1A and 1B show a conventional scan storage element (SSE) and a corresponding scan chain, respectively. When the integrated circuit under test is operating in its normal mode, i.e., the Test Enable (TE) signal is inactive (TE=0), data are loaded into the individual scan storage elements from a data input line D. When in the scan test mode, i.e., the Test Enable signal is active high (TE=1), data are loaded from a scan input line $S_i$. The scan chain shifts serially when TE=1 and loads data in parallel when TE=0. Loading data into a scan chain from the scan input line $S_i$ when TE=1 is referred to as a scan-in operation. Reading data out of the scan chain from serial output line $S_{out}$ is referred to as a scan-out operation.

FIG. 2 shows a typical scan flip-flop circuit utilizable in implementing a scan chain. As shown in FIG. 2, because the scan element has both a normal data input D and a scan input $S_i$, the appropriate input can be selected using a multiplexer controlled by the Test Enable (TE) select signal.

Circuits having set/reset capability, both asynchronous and synchronous, have presented a special challenge to scan operation. The problem is that, when Test Enable is active and shifting is taking place, the set/reset signals must be inhibited to prevent interruption of the serial scan stream.

SUMMARY OF THE INVENTION

The present invention provides set/reset scan flip-flop circuits that normally inhibit set/reset when in the scan mode, but allow a set/reset occurring in the last scan shift cycle to pass through in some unique circumstances. In one embodiment of the invention, the scan circuit includes a multiplexer that receives a data input signal and the scan input signal. The scan input is selected as the multiplexer output when scan Test Enable, which serves as the multiplexer select signal, is active. An OR gate receives the Test Enable signal and the set/reset signal as inputs. Thus, when Test Enable is active high, the OR gate output is also high. The OR gate output is connected to the set/reset pin of the clock edge-triggered scan flip-flop. The multiplexer output drives the data input of the flip-flop. Therefore, assuming that the serf reset signal is active low, when in the scan mode, i.e., Test Enable is active high, the OR gate normally blocks the set/reset signal from the flip-flop. However, when set/reset goes active low in the last scan cycle, the low-going Test Enable allows the set/reset to pass through the OR gate.

In an alternative embodiment of the invention, the clock signal that drives the scan flip-flop circuit of the first embodiment is also provided to the circuit's OR gate. In this way, spurious signals occurring at the beginning of a parallel load cycle are inhibited, thus providing better glitch immunity.

Other features and advantages of the present invention will become apparent and be appreciated by reference to the following detailed description which should be considered in conjunction with the accompanying drawings.

DETAILED DESCRIPTION OF THE INVENTION

Figure 1A:
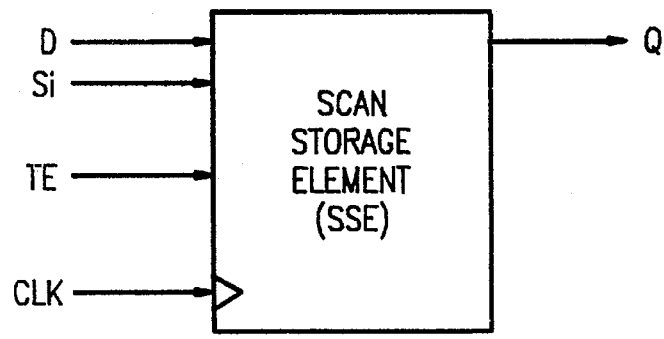
FIG. 1A is a simple block diagram illustrating a conventional scan storage element.
Figure 1B:
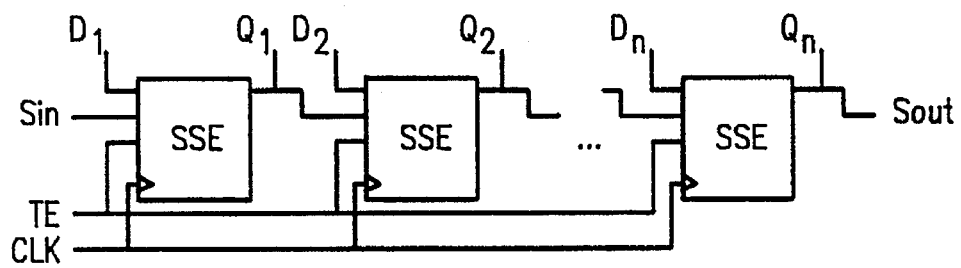
FIG. 1B is a block diagram illustrating a conventional scan register.
Figure 2:
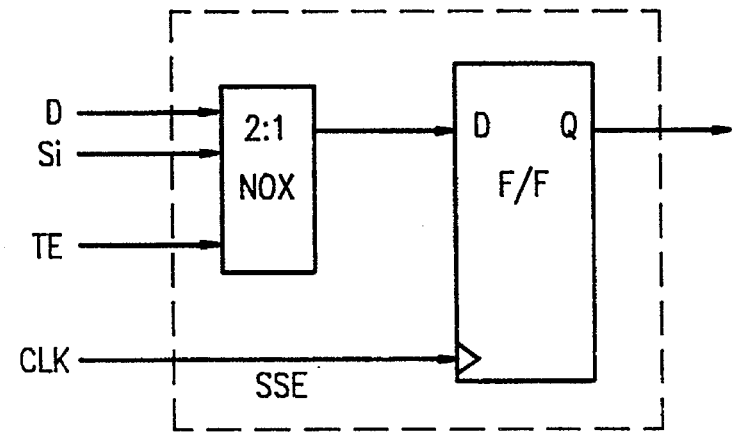
FIG. 2 is a simple block diagram illustrating a conventional scan storage element implemented utilizing an input multiplexer and a clock edge-triggered flip-flop.
Figure 3:
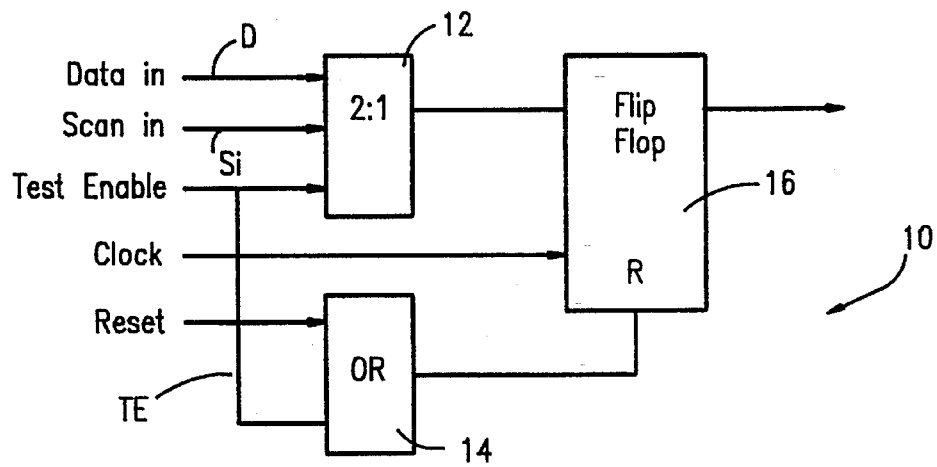
FIG. 3 is a block diagram illustrating an embodiment of a reset scan flip-flop circuit in accordance with the present invention.

FIG. 3 shows a reset scan flip-flop circuit 10 in accordance with the present invention. The scan circuit 10 includes a 2:1 multiplexer 12 that receives a data input signal D and a scan input signal $S_i$. The multiplexer 12 responds to a Test Enable select signal TE by providing the data input signal D as the multiplexer output when Test Enable is inactive (i.e., TE=0) and by providing the scan input signal $S_i$ as the multiplexer output signal when Test Enable TE is active (i.e., TE=1). The Test Enable signal TE and a reset signal are provided as inputs to an OR gate 14. Thus, OR gate 14 provides a logical high output when Test Enable TE is active. In this manner, even if the reset signal is active (i.e., logic low) during a scan shift operation, it is blocked from the OR gate output. As further shown in FIG. 3, the reset scan circuit 10 also includes a flip-flop 16 that receives the multiplexer output signal at its data input. The flip-flop 16 responds to the OR gate output signal applied to its reset pin by providing the multiplexer output signal as a flip-flop output when the OR gate output is high and by providing a logic low output signal when the OR gate output is logic low.

Figure 4:
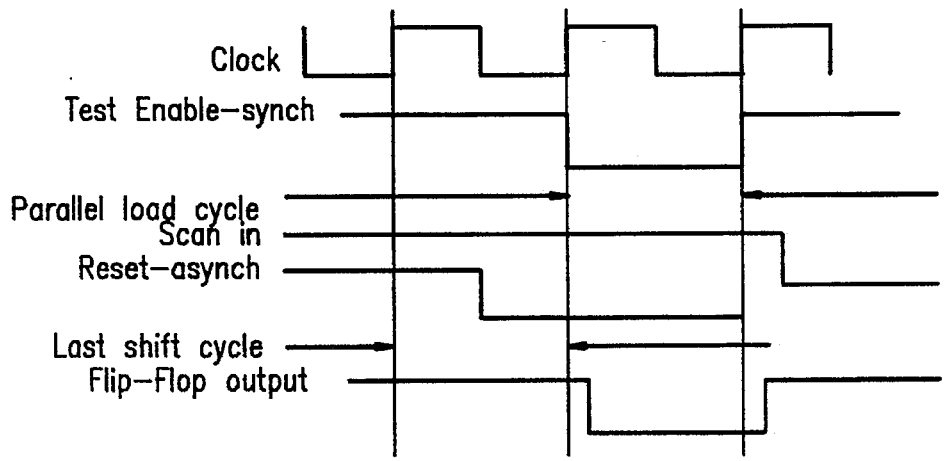
FIG. 4 is a timing diagram illustrating the operation of the FIG. 3 reset scan flip-flop with asynchronous reset and synchronous Test Enable.
Figure 5:
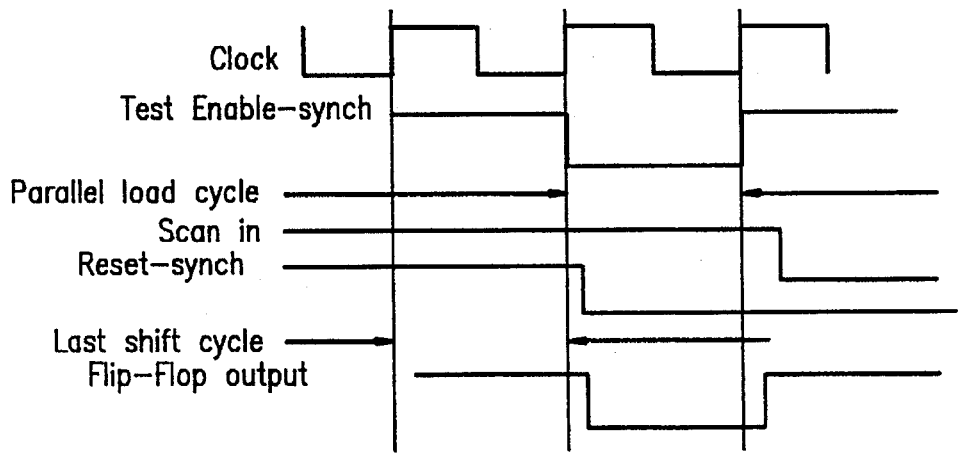
FIG. 5 is a timing diagram illustrating operation of the FIG. 3 reset scan flip-flop with synchronous reset and synchronous Test Enable.
Figure 6:
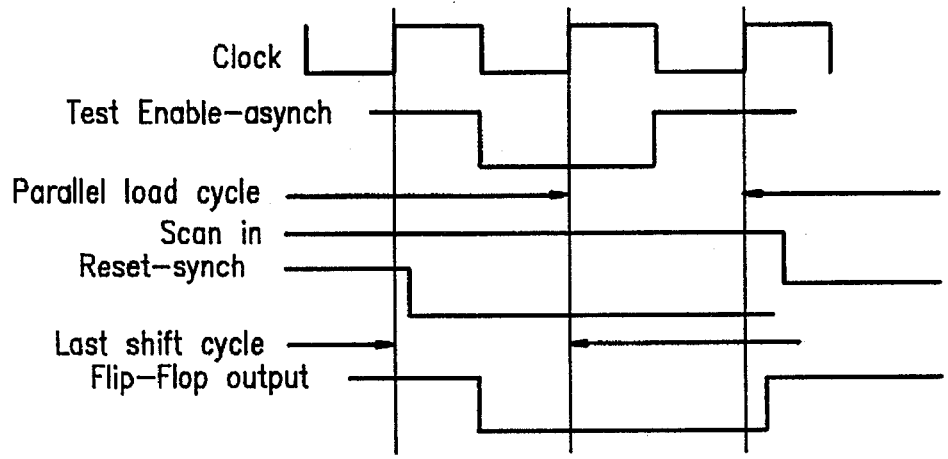
FIG. 6 is a timing diagram illustrating operation of the FIG. 3 reset scan flip-flop with synchronous reset and asynchronous Test Enable.
Figure 7:
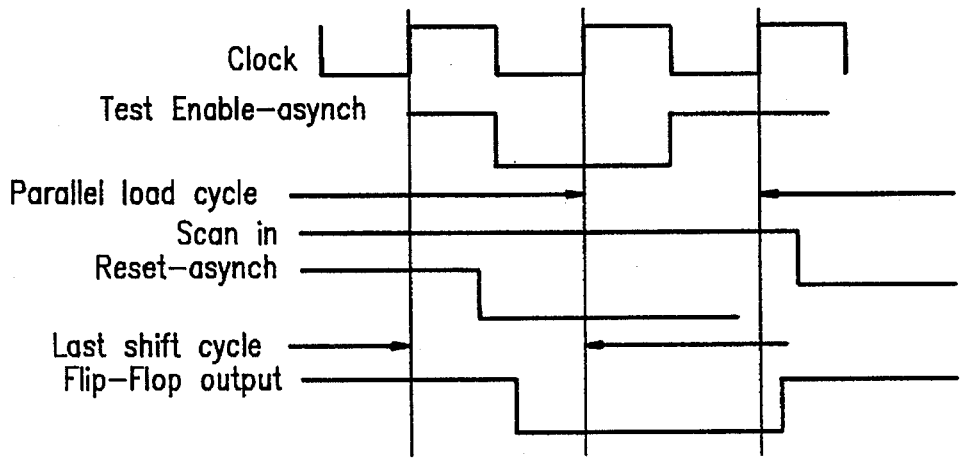
FIG. 7 is a timing diagram illustrating operation of the FIG. 3 reset scan flip-flop with asynchronous reset and asynchronous Test Enable.

As shown in the FIG. 4 timing diagram, although the FIG. 3 circuit functions to inhibit reset during normal scan shift operation, when the low going Test Enable signal for a parallel data load cycle is synchronous, but an asynchronous reset operation is presented to the FIG. 3 circuit in the last scan shift cycle, the reset operation also occurs synchronously. As shown in the FIG. 5 timing diagram, when the low going Test Enable and the reset operation are both synchronous, the FIG. 3 circuit allows the reset operation to drive the flip-flop output. Note, however, that, as shown in the FIG. 6 timing diagram, when the low-going Test Enable is asynchronous, and a synchronous reset operation occurs in the last shift cycle, the FIG. 3 circuit still allows the shift-based reset to pass through to the flip-flop. The FIG. 7 timing diagram shows a similar result in the case where both the low going Test Enable and the reset operation are shift-based asynchronous.

Those skilled in the art will appreciate that the reset scan flip-flop shown in FIG. 3 can also be implemented as a set scan flip-flop circuit with results identical to those described above in conjunction with the FIGS. 4–7 timing diagrams.

Figure 8:
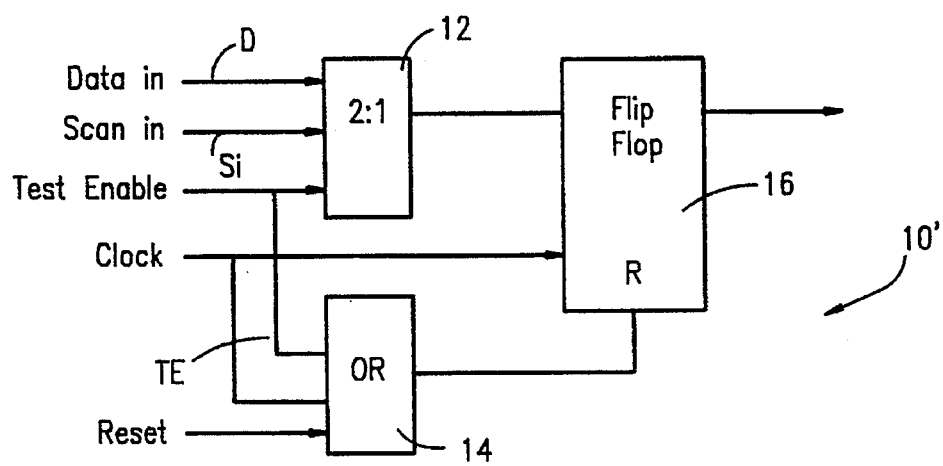
FIG. 8 is a block diagram illustrating an alternative embodiment of a reset scan flip-flop in accordance with the present invention.

FIG. 8 shows an alternative embodiment of a reset scan flip-flop circuit 10' in accordance with the present invention. The elements of the FIG. 8 circuit 10' are the same as those of the FIG. 3 circuit with the exception that the FIG. 8 circuit 10' utilizes a 3-input OR gate 14' to provide clock control to the reset operation, thereby increasing glitch immunity. Those skilled in the art will appreciate that the reset scan flip-flop shown in FIG. 8 can also be implemented as a set scan flip-flop.

Figure 9:
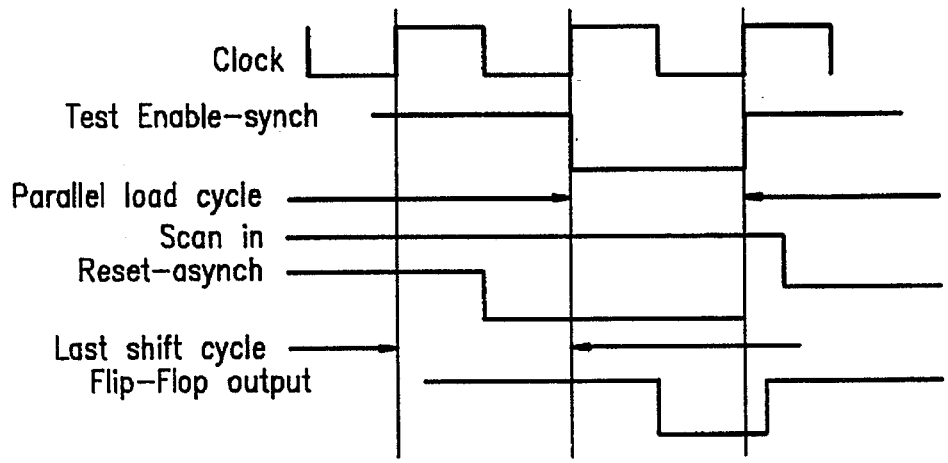
FIG. 9 is a timing diagram illustrating operation of the FIG. 8 reset scan flip-flop with asynchronous reset and synchronous Test Enable.
Figure 10:
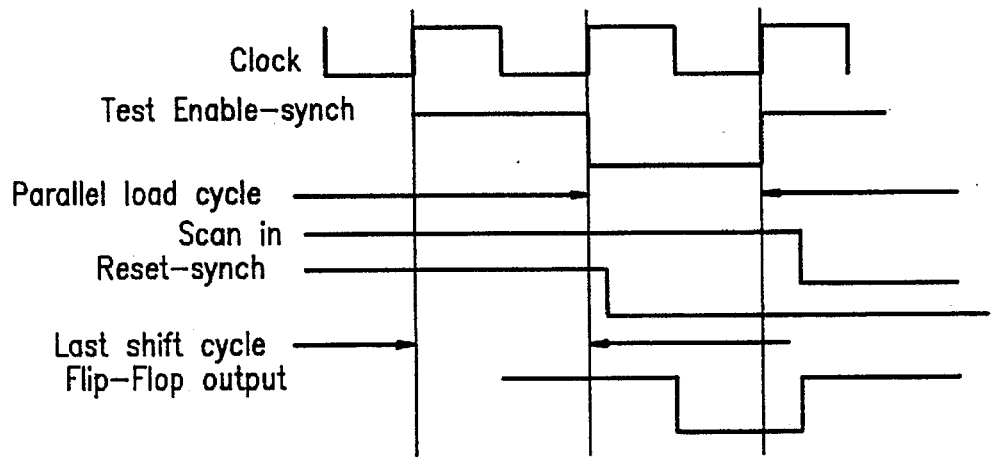
FIG. 10. is a timing diagram illustrating operation of the FIG. 8 reset scan flip-flop with synchronous reset and synchronous Test Enable.
Figure 11:
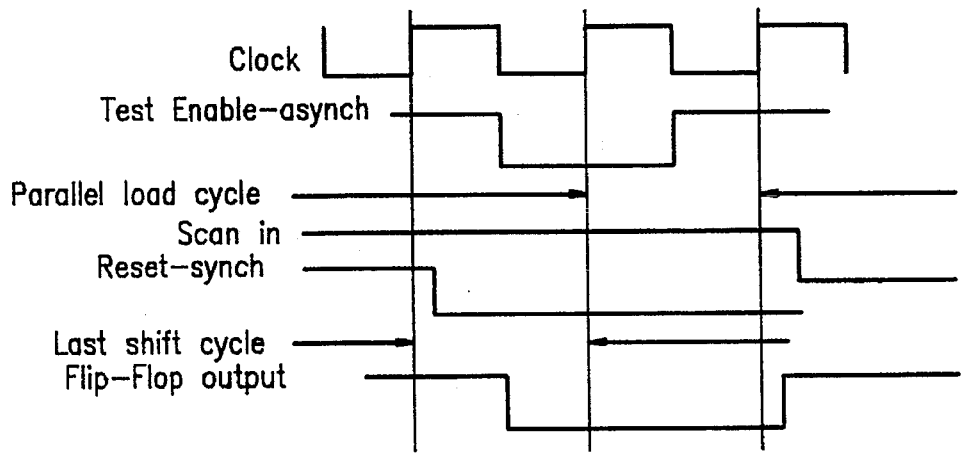
FIG. 11 is a timing diagram illustrating operation of the FIG. 8 reset scan flip-flop with synchronous reset and asynchronous Test Enable.
Figure 12:
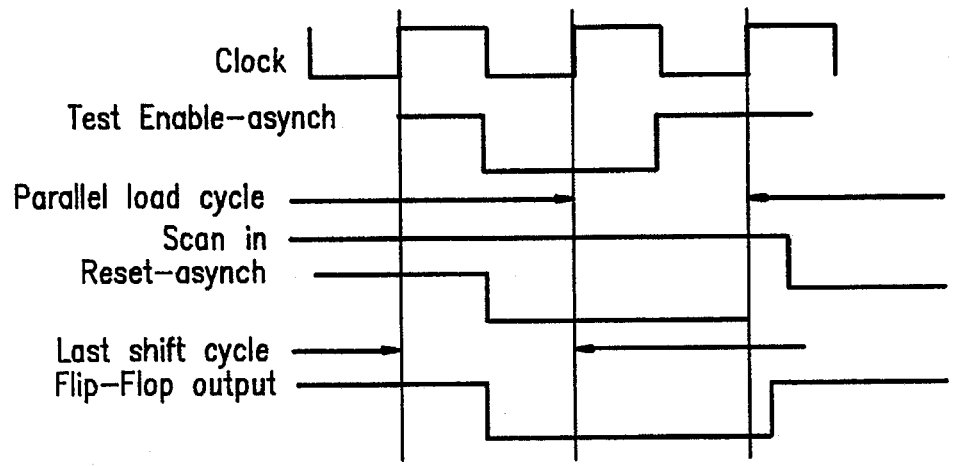
FIG. 12 is a timing diagram illustrating operation of the FIG. 8 reset scan flip-flop with asynchronous reset and asynchronous Test Enable.

As shown in the FIG. 9 timing diagram, in the case of the clock controlled FIG. 8 circuit 10', when the low going Test Enable signal is synchronous and an asynchronous reset operation is presented in the last scan shift cycle, the clock signal inhibits the reset operation until the low-going clock edge in the parallel load cycle. The FIG. 10 timing diagram shows that when the low going Test Enable and the reset operation are both synchronous, the flip-flop output of the FIG. 8 circuit 10' is also controlled by the low-going edge of the clock signal. As in the case of the FIG. 3 circuit, as shown in timing diagrams of FIGS. 11 and 12, when low going Test Enable is asynchronous, the FIG. 8 circuit 10' allows a reset operation presented in the last scan shift cycle to pass through to the flip-flop output.

Figure 13:
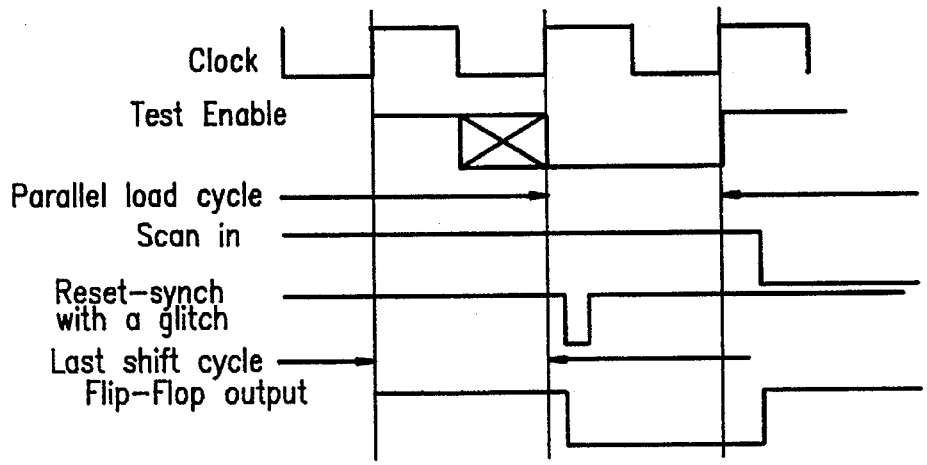
FIG. 13 is a timing diagram illustrating operation of the FIG. 3 reset scan flip-flop with either synchronous or asynchronous Test Enable, and with a glitch in the synchronous reset signal.
Figure 14:
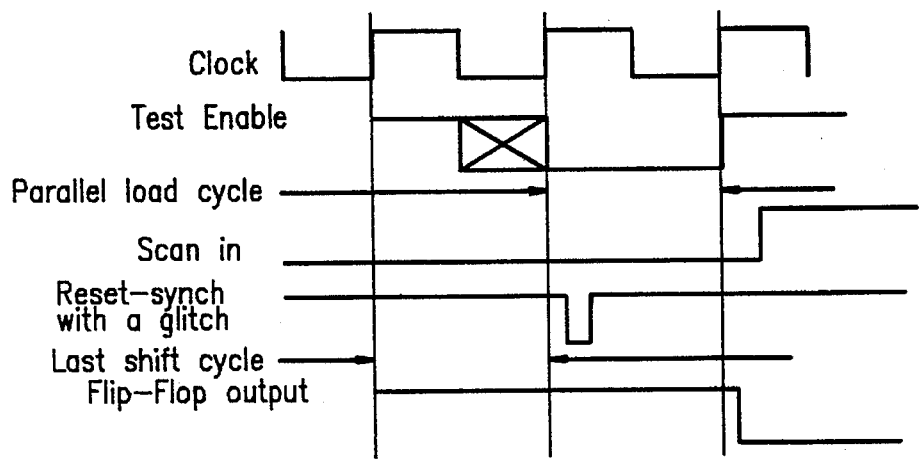
FIG. 14 is a timing diagram illustrating operation of the FIG. 8 reset scan flip-flop with either synchronous or asynchronous Test Enable, and with a glitch in the synchronous reset signal.

As can be seen from the timing diagrams of FIGS. 13 and 14, the FIG. 8 circuit 10' has better "glitch" immunity than does the FIG. 3 circuit. As shown in the FIG. 13 timing diagram, spurious signals occurring at the beginning of the load cycle pass through the OR gate 14 in the FIG. 3 circuit. However, in the FIG. 8 circuit 10', the same glitch is blocked by the clock-controlled OR gate 14', allowing parallel input data to settle to steady state before the low-going clock edge.

It should be understood that various alternatives to the embodiments of the invention described herein may be employed in practicing the invention. It is intended that the following claims define the scope of the invention and that circuits and methods within the scope of these claims and their equivalents be covered thereby.

What is claimed is:

1. A scan circuit comprising:

a multiplexer that receives a data input signal and a scan input signal, the multiplexer being responsive to first and second logic states of a Test Enable select signal such that the multiplexer provides the data input signal as a multiplexer output signal when the Test Enable select signal is in the first logic state and provides the scan input signal as the multiplexer output signal when the Test Enable select signal is in the second logic state;

a logic gate that receives the Test Enable select signal and a set/reset signal as input signals and that provides a logic gate output signal having either the first logic state or the second logic state, the logic gate output signal having the second logic state when the Test Enable select signal is in the second logic state; and a storage element that receives the multiplexer output signal at its storage element data input and that responds to the first and second logic states of the logic gate output signal by providing a multiplexer output signal as a storage element output signal when the logic gate output signal is in the second logic state and by providing a storage element output signal having the first logic state when the logic gate output signal is in the first logic state.

2. A scan circuit as in claim 1 wherein the storage element is a reset flip-flop.

3. A scan circuit as in claim 1 wherein the storage element is a set flip-flop.

4. A reset scan flip-flop circuit comprising:

a 2:1 multiplexer that receives a data input signal and a scan input signal, the multiplexer responding to a high logic level of a Test Enable select signal provided to the multiplexer by providing the scan input signal as a multiplexer output signal;

an OR gate that receives the Test Enable select signal and a reset signal as input signals, whereby an output signal of the OR gate has a high logic level when the Test Enable select signal has the high logic level, and the OR gate output signal has a low logic level only when both the Test Enable select signal and the reset signal have the low logic level; and a reset flip-flop having a data input connected to receive the multiplexer output signal and a reset input connected to receive the OR gate output signal, whereby the reset flip-flop responds to a clock signal applied to the flip-flop by providing the multiplexer output signal to an output of the reset flip-flop when the OR gate output signal is logic high and provides a logic low output signal when the OR gate output signal is logic low.

5. A scan circuit comprising:

a multiplexer that receives a data input signal and a scan input signal, the multiplexer being responsive to first and second logic states of a Test Enable select signal such that the multiplexer provides the data input signal as a multiplexer output signal when the Test Enable select signal is in the first logic state and provides the scan input signal as the multiplexer output signal when the Test Enable select signal is in the second logic state;

a logic gate that receives the Test Enable select signal, a set/reset signal and a clock signal that periodically transitions between the first and second logic states as input signals and that provides a logic gate output signal having either the first logic state or the second logic state, the logic gate output signal having the second logic state when the Test Enable select signal and the clock signal are in the second logic state; and a storage element that receives the multiplexer output signal at its storage element data input and that responds to the first and second logic states of the logic gate output signal by providing a multiplexer output signal as a storage element output signal when the logic gate output signal is in the second logic state and by providing a storage element output signal having the first logic state when the logic gate output signal is in the first logic state.

6. A scan circuit as in claim 5 wherein the storage element is a reset flip-flop.

7. A scan circuit as in claim 5 wherein the storage element is a set flip-flop.

8. A reset scan flip-flop circuit comprising:

a 2:1 multiplexer that receives a data input signal and a scan input signal, the multiplexer responding to a high logic level of a Test Enable select signal provided to the multiplexer by providing the scan input signal as a multiplexer output signal;

an OR gate that receives the Test Enable select signal, a reset signal and a clock signal that periodically transitions between the first and second logic states as input signals, whereby an output signal of the OR gate has a high logic level when the Test Enable select signal has the high logic level, and the OR gate output signal has a low logic level only when each of the Test Enable select signal, the reset signal and the clock signal has the low logic level; and a reset flip-flop having a data input connected to receive the multiplexer output signal and a reset input connected to receive the OR gate output signal, whereby the reset flip-flop responds to a clock signal applied to the flip-flop by providing the multiplexer output signal to an output of the reset flip-flop when the OR gate output signal has the high logic level and provides a logic low output signal when the OR gate output signal has the low logic level.

* * * * *